United States Patent
Kabra et al.

(10) Patent No.: US 12,151,488 B2
(45) Date of Patent: Nov. 26, 2024

(54) THERMAL INKJET PRINTER WITH INTEGRATED COOLING

(71) Applicant: CONTROL PRINT LIMITED, Maharashtra (IN)

(72) Inventors: Shiva Basant Kabra, Mumbai (IN); Sunil Sadanand Wakade, Mumbai (IN); Rajender Choudhary, Mumbai (IN)

(73) Assignee: CONTROL PRINT LIMITED (IN)

( * ) Notice: Subject to any disclaimer, the term of this patent is extended or adjusted under 35 U.S.C. 154(b) by 122 days.

(21) Appl. No.: 17/800,190

(22) PCT Filed: Feb. 22, 2021

(86) PCT No.: PCT/IB2021/051485
§ 371 (c)(1),
(2) Date: Aug. 16, 2022

(87) PCT Pub. No.: WO2021/165937
PCT Pub. Date: Aug. 26, 2021

(65) Prior Publication Data
US 2023/0062172 A1    Mar. 2, 2023

(30) Foreign Application Priority Data
Feb. 20, 2020   (IN) .............................. 202021007362

(51) Int. Cl.
*B41J 29/377*   (2006.01)
*B41J 2/175*    (2006.01)
*H05K 7/20*     (2006.01)

(52) U.S. Cl.
CPC ........ *B41J 29/377* (2013.01); *H05K 7/20263* (2013.01); *H05K 7/20272* (2013.01); *B41J 2/17513* (2013.01)

(58) Field of Classification Search
CPC ........ B41J 29/377; B41J 2/17513; B41J 2/32; H05K 7/20263; H05K 7/20272
See application file for complete search history.

(56) References Cited

U.S. PATENT DOCUMENTS

| | | | |
|---|---|---|---|
| 7,918,540 | B2 | 4/2011 | Silverbrook |
| 2007/0222807 | A1 | 9/2007 | Silverbrook |

FOREIGN PATENT DOCUMENTS

| | | | | |
|---|---|---|---|---|
| CN | 1202424 A | 12/1998 | | |
| EP | 0573062 A2 | 12/1993 | | |
| EP | 885721 A2 | * 12/1998 | ............ | B41J 2/1408 |

OTHER PUBLICATIONS

Cook W P et al. (EP 0 885 721 A23), Ink-jet Cartridge With Active Cooling Cell Has Printhead With Heater Chip Generating Ink Droplets And Uses Thermoelectric Cooling Cell To Cool Cartridge As Function Of Energy To Chip, Dec. 2, 19983 (Year: 1998).*

(Continued)

*Primary Examiner* — Lisa Solomon (57) ABSTRACT

The present invention relates to a thermal ink jet printer capable of performing continuously by maintaining consistent print quality and optimum cartridge life. More particularly, the present invention relates to a print head assembly of a thermal ink jet printer comprising of a cooling system for ink inside the cartridge, an airtight chamber to prevent heat losses into atmosphere and prevents condensation of air from atmosphere.

10 Claims, 5 Drawing Sheets

(56) References Cited

OTHER PUBLICATIONS

International Search Report for International Application No. PCT/IB2021/051485 dated Jun. 24, 2021, pp. 1-3.
Written Opinion of the International Searching Authority for International Application No. PCT/IB2021/051485 dated Jun. 24, 2021, pp. 1-5.

* cited by examiner

THERMAL INKJET PRINTER WITH INTEGRATED COOLING

FIELD OF THE INVENTION

The present invention relates to a thermal ink jet printer capable of performing continuously by maintaining consistent print quality and optimum cartridge life. More particularly, the present invention relates to a print head assembly of a thermal ink jet printer comprising of a cooling system for ink inside the cartridge, an airtight chamber to prevent heat losses into atmosphere and prevents condensation of air from atmosphere.

BACKGROUND OF THE INVENTION

Thermal ink jet printers use thermal energy or electrical signals to heat droplets of ink and apply it to a medium. The dots are extremely small and positioned very precisely and create photo-quality images. It prints on a wide variety of surfaces including regular and specialty papers, plastics, metals and cartons. The thermal ink jet printers work in ambient temperature ranging from 20-25 degrees centigrade with full efficiency.

When ambient temperature is as high as 40 degrees centigrade or more, usage of thermal ink jet printers is not recommended because solvent ink cartridges stop performing at this high ambient temperature. At higher temperatures evaporation of solvents becomes faster, hence ink in the nozzles starts drying quickly, leading to deterioration in print quality/performance of thermal ink jet equipment's. Due to above stated drawbacks, CIJ printer technology has become prevalent.

Continuous Ink Jet systems (CIJ) work by expelling electrically charged ink droplets from a print head nozzle and passing them through an electric field. The ink jet is broken into drops inside the chamber through a pulse from the piezoelectric crystal. The droplets that are required for printing are charged by an electrode as they break off from the ink jet and the printer re-circulates the rest. CIJ is a highly versatile inkjet technology, ideal for a wide array of uses in many industries and capable of marking most substrates. The continuous inkjet printing is simpler than many of the complicated technologies used in coding/marking products today. Although the CIJ printers offer variety of advantages but has some drawbacks such as initial investment is higher compared to thermal inkjet printing technology, complexity level in operation is more. Also, in CIJ printers, a great amount of maintenance is required. In addition, the equipment used in CIJ technology is costly, comparatively oversize and space demanding. In view of such drawbacks, CIJ technology is not affordable to all. Hence, a lot of research is going to develop a technology which is affordable and allows quality printing even at high ambient temperatures.

US20070222807A1 discloses a print head and method of operation for controlling the print quality using temperature. A sensor senses the print head temperature before printing begins. The controller compares it to a threshold temperature that represents desired ink drop characteristics. If the print head temperature is below the threshold, it initiates heating elements and adjusts the heating elements until the threshold temperature has been reached. The main drawback of the invention is that the printer works effectively till 30 degrees centigrade.

U.S. Pat. No. 7,918,540B2 discloses a micro electro mechanical ink jet print head that includes a number of groups of ink ejection nozzles. Each group has a temperature sensor that is monitored by a processor incorporating the print head. In order to maintain printing ink at a constant viscosity the processor compares temperature signals from the sensors to a predetermined threshold. The temperature signals indicate that the print head is below a predetermined temperature then the processor applies heating pulses to the print head. The heating pulses are of sufficient energy to cause warming of the print head ink but insufficient to cause actual ink ejection. In this way ink ejection droplet size, and hence print quality, is maintained in spite of operating temperature fluctuations. The main drawback of the invention is that self-cooling of this printer only allows cooling of the printer with a maximum range of 40 degrees centigrade. If ambient temperature increases further, nozzles of ink starts drying quickly and print quality does not remain consistent hence product reliability becomes questionable.

Therefore, there is a need to develop a printing technology that works effectively at high ambient temperatures.

OBJECT OF THE INVENTION

The main object of the present invention is to provide a print head assembly of a thermal ink jet printer (TIJ) with an integrated liquid coolant-based heat sink system to provide a differential temperature and an air tight chamber to prevent heat losses into the atmosphere.

Another object of the present invention is to provide a print head assembly of a thermal ink jet printer (TIJ) with a liquid coolant-based heat sink system that slows down the evaporation of liquid in cartridge and works at high temperature.

Yet another object of the present invention is to provide a print head assembly of a thermal ink jet printer (TIJ) with an airtight cartridge chamber to prevent heat losses into atmosphere and reduce condensation of air from atmosphere.

Still another object of the present invention is to provide a thermal ink jet printer (TIJ) that operates for fluid based thermal ink jet cartridge using an integrated cooling system.

SUMMARY OF THE INVENTION

The present invention relates to a thermal ink jet printer that prevents evaporation of solvent at high temperature using a liquid coolant-based heat sink system and air tight cartridge chamber.

In a main embodiment, the present invention provides a thermal inkjet printer with integrated cooling having a print head assembly comprising of a pump, a plurality of electronic mounting board, a print head, a cartridge chamber and a cooling system.

The cooling system comprises a cooling block, at least one temperature sensors, plurality of coolant tubes, a peltier, a radiator fan and an insulation block. The radiator fan with the plurality of coolant tubes is externally connected to the print head. The cartridge chamber is mounted on the print head and said chamber and said radiator fan with coolant tubes are plugged in and sealed to the print head. The sealing is done through a plurality of sealing elements such as but not limited to rubber that provides an airtight chamber thus preventing condensation of air. The cooling system maintains a temperature of fluid inside cartridge and works at temperature greater than 40 degrees. The radiator fan with the plurality of coolant tubes acts as a heat sink that releases the heat into the atmosphere. The temperature of fluid in cartridge chamber is controlled by the temperature controller of the cooling unit. The temperature controller regulates the switching of peltier by comparing a detected temperature of the fluid received from the temperature sensor with a predefined temperature.

In another embodiment, the present invention provides a temperature controller in the print head assembly of a thermal ink jet printer. The temperature controller is provided to compares detected temperature from a sensor with a predefined temperature and regulates the switching of a peltier. When the temperature controller detects fluid temperature falling in the range of ±2 degrees of the predefined temperature, thereby switching off the pelteir. When the temperature controller detects fluid temperature not falling in the range of ±2 degrees of the predefined temperature, thereby switching on the pelteir to slow down the evaporation rate of fluid and said printer works at temperatures greater than 40 degrees.

In yet another embodiment, the present invention provides a print head in the print head assembly of a thermal ink jet printer. The print head is comprising a side cover provided with a provision for attachment of a plurality of coolant tubes and an another side cover with a provision for inserting smart card in the smart card holder.

In yet another embodiment, the present invention provides a cartridge chamber in the print head assembly of a thermal ink jet printer consists of a cartridge with a plurality of levers.

In still another embodiment, the present invention provides a plurality of electronic mounting board in the print head assembly of a thermal ink jet printer which mounted on an electronic mounting plate.

The present invention relates to a thermal ink jet printer capable of performing continuously by maintaining consistent print quality and optimum cartridge life. More particularly, the present invention relates to a print head assembly of a thermal ink jet printer comprising of a cooling system for ink inside the cartridge, an airtight chamber to prevent heat losses into atmosphere and prevents condensation of air from atmosphere.

BRIEF DESCRIPTION OF THE DRAWING

An understanding of the device of the present invention may be obtained by reference to the following drawings.

DETAILED DESCRIPTION OF THE INVENTION

Many aspects of the invention can be better understood with references made to the drawings below. The components in the drawings are not necessarily drawn to scale. Instead, emphasis is placed upon clearly illustrating the components of the present invention. Moreover, like reference numerals designate corresponding parts through the several views in the drawings. Before explaining at least one embodiment of the invention, it is to be understood that the embodiments of the invention are not limited in their application to the details of construction and to the arrangement of the components set forth in the following description or illustrated in the drawings. The embodiments of the invention are capable of being practiced and carried out in various ways. In addition, the phraseology and terminology employed herein are for the purpose of description and should not be regarded as limiting.

The present invention provides a thermal ink jet printer that works effectively at high temperatures by slowing down the evaporation rate of liquid through nozzles. The printer performs continuously by maintaining consistent print quality and optimum cartridge and nozzles life. The thermal ink jet printer has a print head assembly that comprises of a liquid coolant-based heat sink system that provides a differential temperature and an airtight chamber that prevents heat losses into the atmosphere.

In a main embodiment, the present invention provides a thermal inkjet printer with integrated cooling having a print head assembly comprising of a print head, a cartridge chamber and a cooling system. The cooling system comprises a cooling block, at least one temperature sensor, plurality of coolant tubes, a peltier, a radiator fan and an insulation block. The radiator fan with the plurality of coolant tubes is externally connected to the print head. The cartridge chamber is mounted on the print head and said chamber and said radiator fan with coolant tubes of cooling system are plugged in and sealed to the print head. The sealing is done through a plurality of sealing elements such as but not limited to rubber that provides an airtight chamber thus preventing condensation of air. The cooling system maintains a temperature of fluid inside cartridge and works at temperature greater than 40 degrees. The radiator fan with the plurality of coolant tubes acts as a heat sink that releases the heat into the atmosphere. The temperature of fluid in cartridge chamber is controlled by the temperature controller of the cooling unit. The temperature controller regulates the switching of peltier by comparing a detected temperature of the fluid received from the temperature sensor with a predefined temperature.

Figure 1:
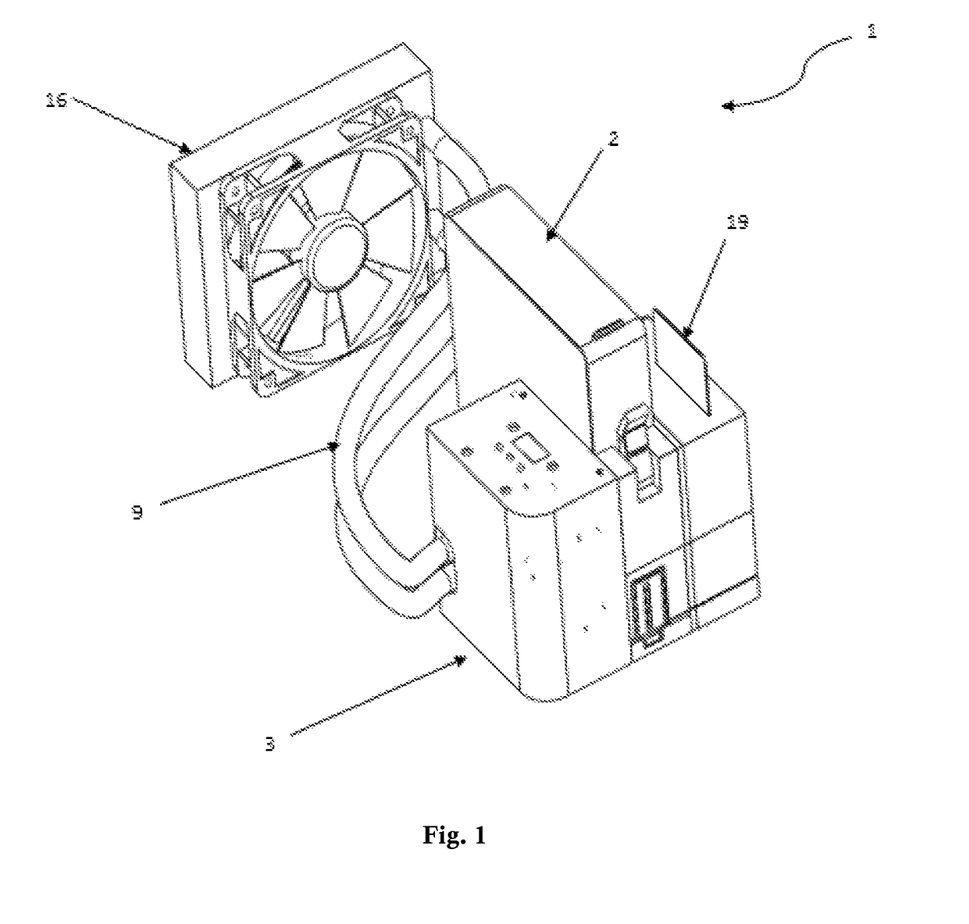
FIG. 1 shows a perspective view of print head assembly of thermal ink jet printer in accordance with an embodiment of the present invention.

Now referring to FIG. 1, the present invention shows a perspective view of print head assembly of thermal ink jet printer. The print head assembly 1 comprises of a print head 3, a mountable cartridge chamber 2 and a cooling system. The cooling system includes a radiator fan 16 with a plurality of coolant tubes 9 externally connected to said print head 3. The cartridge chamber 2 and said radiator fan 16 with coolant tubes 9 are plugged in and sealed in the print head 3 thus providing the airtight chamber. A smart card 19 is inserted in smart card holder of the print head 3.

Figure 2:
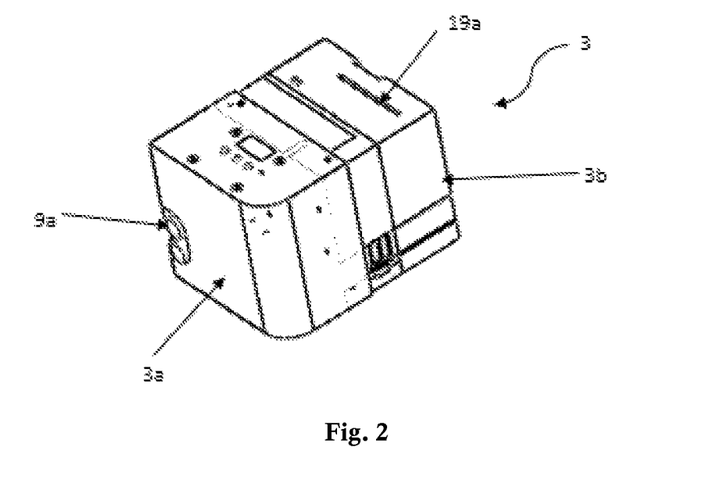
FIG. 2 shows a perspective view of print head of print head assembly of thermal ink jet printer in accordance with an embodiment of the present invention.

Now referring to FIG. 2, the present invention shows a perspective view of the print head 3. The print head 3 has a side cover 3a provided with a provision 9a for attachment of coolant tubes and an another side cover 3b with a provision 19a for inserting smart card in the smart card holder.

Figure 3A:
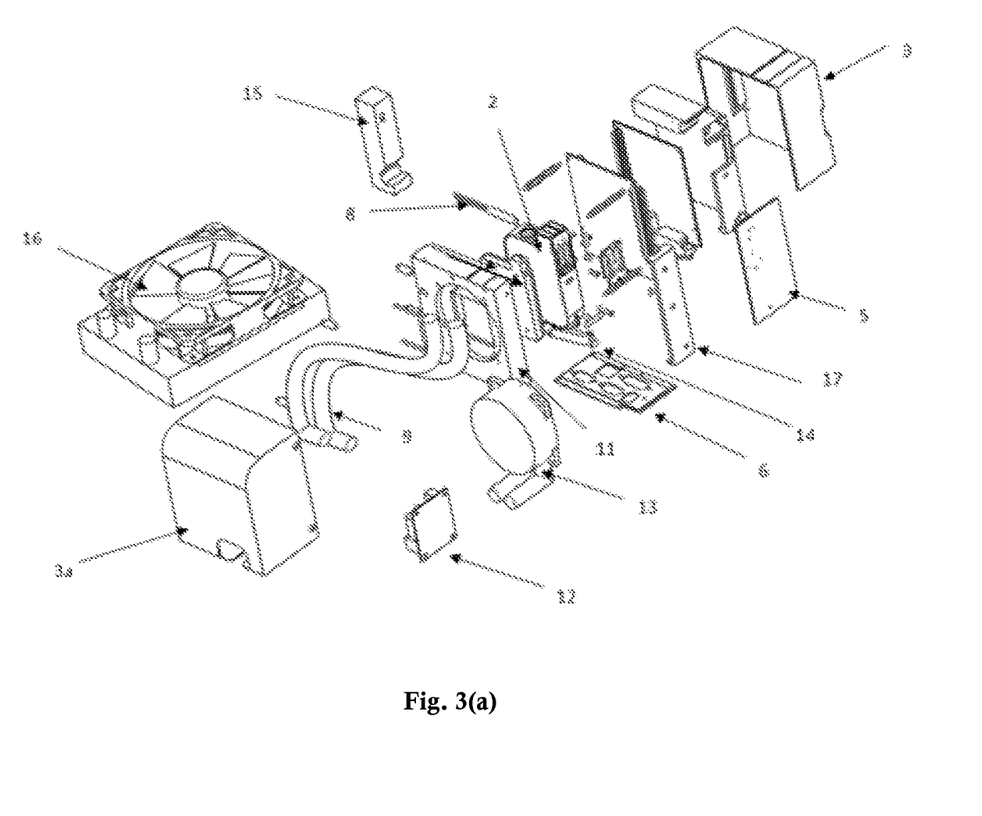
FIGS. 3(a) and 3(b) shows an exploded view of print head assembly of thermal ink jet printer in accordance with an embodiment of the present invention.
Figure 3B:
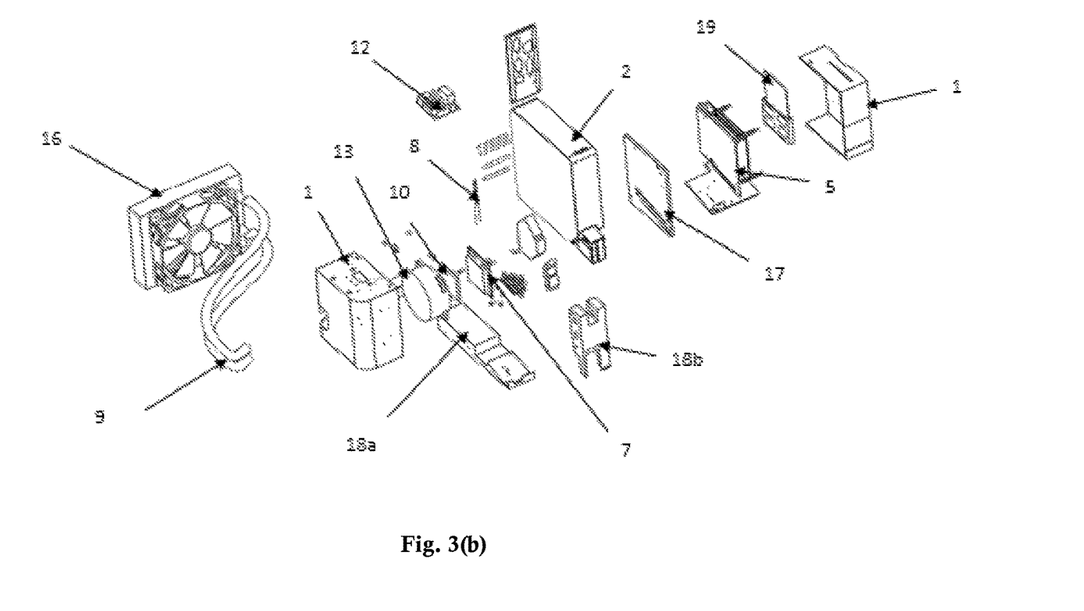

Now referring to FIGS. 3(a) and 3(b), the present invention shows an exploded view of print head assembly 1 of thermal ink jet printer. The printer head assembly 1 comprises of a print head 3 (not shown), a cartridge chamber 2 and a cooling system. The print head assembly 1 includes a plurality of components such as but not limited to a cooling system, a cartridge chamber 2, a plurality of electronic mounting board 5 mounted on an electronic mounting plate 6, a pump 13. The print head 3 is fitted with a smart card holder having a smart card 19 to perform printing functions. The cooling system comprises of a cooling block 7, at least one temperature sensor 8 controlled by a temperature controller 12, a peltier 10, an insulation block 11 from said peltier 10 and radiator fan 16 with a plurality of coolant tubes 9. The cartridge chamber 2 consists of a cartridge with a plurality of levers 14. The chamber 2 is sealed to the print head 3 through an isolating rubber 15 thus making it airtight chamber. The radiator fan 16 is externally attached to the print head 3 through a plurality of coolant tubes 9. The cartridge chamber 2 is concealed by a cover 17 and mounted on the cooling block 7 and the cooling system is concealed by a cover 18a, 18b. Said chamber 2 and said cooling system are assembled together and housed by the print head 3 thus forming the complete print head assembly 1.

The radiator fan 16 with the coolant tubes 9 acts as a heat sink for releasing the heat into the atmosphere. The side cover 3a, 3b of print head 3 are made of material such as but not limited to stainless steel. The cooling system slows down the evaporation rate of fluid through the cartridge and provides a differential temperature. The cooling rate is adjusted by the temperature sensors 8 being controlled and monitored by temperature controller 12. The temperature controller 12 controls the temperature by switching on and off the Peltier 10 when the temperature of fluid changes with the respect to a pre-defined temperature. The airtight chamber prevents condensation of air and heat losses into the atmosphere. The cooling block 7 cools fluid inside the cartridge and fluid does not dry and the printer works on temperature greater than 40 degrees.

Figure 4:
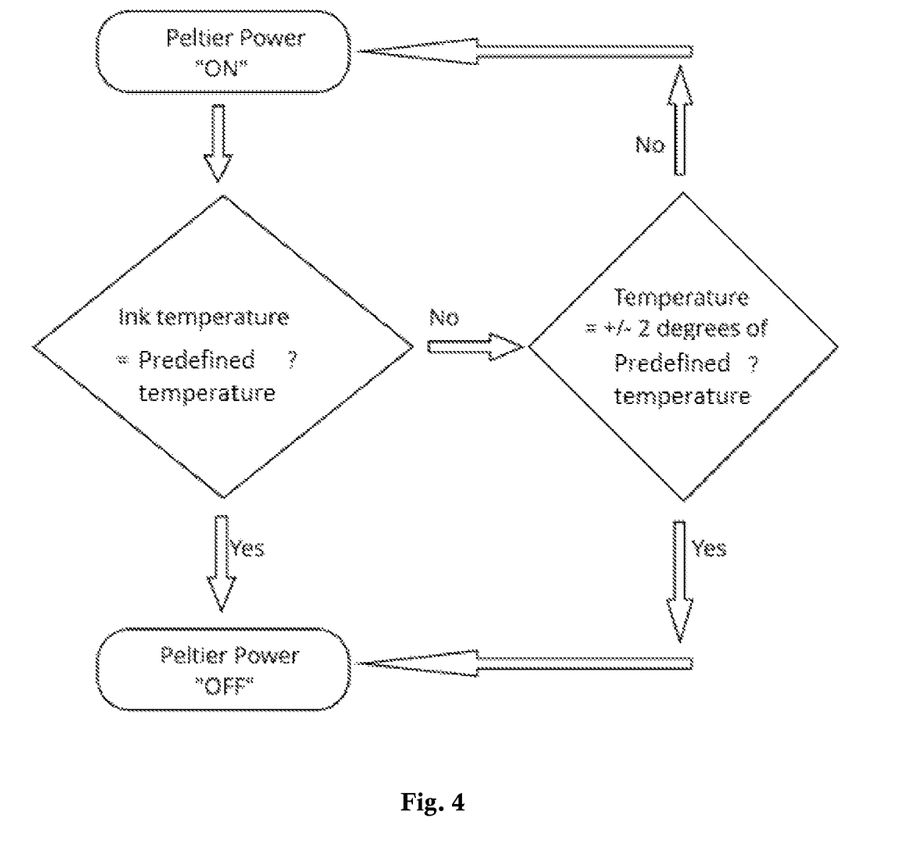
FIG. 4 shows a temperature control flow chart of print head assembly of thermal ink jet printer in accordance with an embodiment of the present invention.

Now referring to FIG. 4, the present invention shows the temperature control flowchart of thermal ink jet printer. The temperature of the fluid is controlled by a temperature controller 12 and sensed by the temperature sensor 8. The temperature controller compares the detected temperature from the sensor 8 with the predefined temperature and regulates the switching of peltier 10. When the detected fluid temperature is same as the predefined temperature, the temperature controller 12 switches off the peltier 10. When the detected fluid temperature is in the range of ±2 degrees of the predefined temperature, the temperature controller 12 switches off the peltier 10. When the detected fluid temperature is not in the range of ±2 degrees of the predefined temperature, the temperature controller 12 switches on the peltier 10. This mechanism slows down the evaporation rate of fluid and said printer works at temperatures greater than 40 degrees.

Therefore, the present invention provides a thermal ink jet printer having a print head assembly. The print head assembly has a print head with an integrated cooling system that cools the fluid inside the cartridge chamber and slows down the evaporation rate of fluid and a cartridge chamber. The printer provides an effective print quality by running a hassle-free operation at high ambient temperature greater than 40 degrees. The printer minimizes the condensation of water droplets in humid environment also prevents heat losses into the atmosphere by its airtight chamber.

While considerable emphasis has been placed herein on the particular features of this invention, it will be appreciated that various modifications can be made, and that many changes can be made in the preferred embodiments without departing from the principles of the invention. These and other modifications in the nature of the invention or the preferred embodiments will be apparent to those skilled in the art from the disclosure herein, whereby it is to be distinctly understood that the foregoing descriptive matter is to be interpreted merely as illustrative of the invention and not as a limitation.

We claim:

1. A thermal inkjet printer with integrated cooling having a print head assembly (1) comprising:
    a print head (3);
    a cartridge chamber (2) mounted on said print head (3); and
    a cooling system;
    wherein,
    said cooling system comprises a cooling block (7), at least one temperature sensor (8), a plurality of coolant tubes (9), a peltier (10), a radiator fan (16) and an insulation block (11);
    said cartridge chamber (2) and said radiator fan (16) in connection with said plurality of coolant tubes (9) are plugged in and sealed to said print head (3) to provide an airtight chamber thus preventing condensation of air and heat losses in to atmosphere;
    said cooling block (7) maintains temperature of a fluid inside said cartridge chamber (2) to prevent dryness in said fluid;
    said radiator fan (16) with said coolant tubes (9) acts as a heat sink that releases heat into the atmosphere;
    a temperature controller (12) regulates switching of said peltier (10) by comparing a detected temperature of said fluid received from said temperature sensor (8) with a predefined temperature that maintains an evaporation rate of said fluid and provides a differential temperature; and
    said cooling system minimizes condensation of water droplets in humid environment and prevents heat losses in to said atmosphere by said airtight chamber.

2. The thermal inkjet printer with integrated cooling having a print head assembly (1) as claimed in claim 1, wherein said cartridge chamber (2) and said radiator fan (16) are sealed to the print head (3) through a plurality of sealing elements including but not limited to rubber, cartridge seals, fluoro-silicone.

3. The thermal inkjet printer with integrated cooling having a print head assembly (1) as claimed in claim 1, wherein said cooling system works at temperature greater than 40 degrees.

4. The thermal inkjet printer with integrated cooling having a print head assembly (1) as claimed in claim 1, wherein said print head (3) is fitted with a smart card holder in which a smart card (19) to perform printing functions is inserted.

5. The thermal inkjet printer with integrated cooling having a print head assembly (1) as claimed in claim 1, wherein said print head (3) has a side cover (3a) provided with a provision (9a) for attachment of said coolant tubes (9) and an another side cover (3b) with a provision (19a) for inserting said smart card (19) in said smart card holder.

6. The thermal inkjet printer with integrated cooling having a print head assembly (1) as claimed in claim 1, wherein said cartridge chamber (2) is concealed by a cover (17) and mounted on said cooling block (7) and said cooling system is concealed by a cover (18a), (18b).

7. The thermal inkjet printer with integrated cooling having a print head assembly (1) as claimed in claim 1, wherein said print head assembly (1) includes a plurality of components including but not limited to a plurality of electronic mounting board (5) mounted on an electronic mounting plate (6), and a pump (13).

8. The thermal inkjet printer with integrated cooling having a print head assembly (1) as claimed in claim 5, wherein said side cover (3a), (3b) of said print head (3) are made of material such as but not limited to stainless steel.

9. The thermal inkjet printer with integrated cooling having a print head assembly (1) as claimed in claim 1, wherein said cartridge chamber (2) includes a cartridge with a plurality of levers (14).

10. The thermal inkjet printer with integrated cooling having a print head assembly (1) as claimed in claim 1, wherein said detected fluid temperature is equal to said predefined temperature then said temperature controller (12) switches off said peltier (10) and in case said detected fluid temperature is not equal to said predefined temperature then said temperature controller (12) switches on said peltier (10).

\* \* \* \* \*